United States Patent
Farooq et al.

(10) Patent No.: US 6,719,188 B2
(45) Date of Patent: Apr. 13, 2004

(54) REWORK METHODS FOR LEAD BGA/CGA

(75) Inventors: Mukta G. Farooq, Hopewell Junction, NY (US); Raymond A. Jackson, Beacon, NY (US); David C. Linnell, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/912,192

(22) Filed: Jul. 24, 2001

(65) Prior Publication Data

US 2003/0019918 A1 Jan. 30, 2003

(51) Int. Cl.[7] .................. B23K 1/018; B23K 28/00; B23P 19/00
(52) U.S. Cl. .................. 228/264; 228/13; 228/20.5; 29/426.1; 29/762; 29/764
(58) Field of Search .................. 228/264, 219, 228/119, 20.1, 20.5, 13, 19; 219/228, 237; 29/426.1, 762, 764

(56) References Cited

U.S. PATENT DOCUMENTS

| | | | | |
|---|---|---|---|---|
| 3,903,581 A | * | 9/1975 | Michel | 29/831 |
| 4,571,482 A | | 2/1986 | Vogel | |
| 4,602,733 A | * | 7/1986 | Slack et al. | 228/235.1 |
| 4,606,492 A | * | 8/1986 | Guslits | 228/179.1 |
| 4,771,932 A | | 9/1988 | Kim | |
| 4,785,793 A | * | 11/1988 | Oglesby et al. | 126/413 |
| 4,846,032 A | * | 7/1989 | Jampathom et al. | 83/51 |
| 4,896,019 A | * | 1/1990 | Hyun | 219/228 |
| 5,220,147 A | * | 6/1993 | Spigarelli et al. | 219/230 |
| 5,229,575 A | * | 7/1993 | Waller et al. | 219/221 |
| 5,427,641 A | * | 6/1995 | Muramatsu et al. | 156/250 |
| 5,458,281 A | * | 10/1995 | Downing et al. | 228/264 |
| 5,938,882 A | * | 8/1999 | Bryant et al. | 156/344 |
| 5,980,372 A | | 11/1999 | Spishak | |
| 6,024,080 A | | 2/2000 | Hodsden | |
| 6,053,393 A | | 4/2000 | Burke et al. | |
| 6,065,462 A | | 5/2000 | Hodsden et al. | |
| 6,119,325 A | * | 9/2000 | Black et al. | 29/426.1 |
| 6,182,884 B1 | | 2/2001 | Ma et al. | |
| 6,186,387 B1 | | 2/2001 | Lawrence et al. | |
| 6,235,996 B1 | | 5/2001 | Farooq et al. | |
| 6,267,650 B1 | * | 7/2001 | Hembree | 451/388 |
| 6,305,261 B1 | * | 10/2001 | Romanini | 83/53 |
| 6,440,215 B1 | * | 8/2002 | Lymn et al. | 118/62 |
| 6,539,618 B1 | * | 4/2003 | Lyke | 29/762 |

FOREIGN PATENT DOCUMENTS

| | | |
|---|---|---|
| JP | 4183571 A | 6/1992 |
| JP | 09140534 | 12/1998 |
| JP | 2000-151093 A * | 5/2000 |

* cited by examiner

*Primary Examiner*—L. Edmondson
(74) *Attorney, Agent, or Firm*—DeLio & Peterson, LLC; John J. Tomaszewski; James J. Cioffi

(57) ABSTRACT

A method and apparatus are provided for reworking electronic component assemblies where the components are joined by solder interconnections. A cutting device employing a heated wire, blade or other cutting element is forced against and through the solder interconnections to sever the interconnections. A preferred cutting device employs moving the cutting element transverse to the solder interconnections to also provide a sawing action to the solder interconnections. Another cutting device employs a water jet to provide a high pressure stream of water that cuts and severs the solder interconnections.

6 Claims, 4 Drawing Sheets

REWORK METHODS FOR LEAD BGA/CGA

BACKGROUND OF THE INVENTION

1. Field of the Invention

This invention relates generally to electronic component assemblies wherein the electronic components are joined together by solder interconnections and, more particularly, to the rework of such assemblies by removing one component from another joined component.

2. Description of Related Art

Forming an electronic package assembly whereby an electrical component such as an integrated circuit chip is electrically and mechanically connected to a substrate such as a card, or board, another chip or another electronic part is well-known in the art. This technology is generally termed surface mount technology (SMT) and has gained acceptance as the preferred means of making electronic package assemblies. In one particular application, to which this application is directed to for convenience, multilayer ceramic components, as exemplified by integrated circuit chips, are joined to printed circuit cards or boards which boards are to be reworked by removing defective or unwanted chips from the board.

Multilayer ceramic electronic components are typically joined to printed circuit boards by soldering pads on a surface of one of the electronic components to corresponding soldering pads on the surface of the other component. Control Collapse Chip Connection is an interconnect technology developed by IBM as an alternative to wire bonding. This technology is generally known as C4 technology or flip chip packaging. Broadly stated, an integrated circuit chip is mounted above a board and pads on the chip are electrically and mechanically connected to corresponding pads on the board by a plurality of electrical connections such as solder bumps. The integrated circuit chips may be assembled in a solder array such as 10×10 array.

In the C4 interconnect technology, a relatively small solder bump is attached to the pads on one of the components being joined, typically to the chip. The electrical and mechanical interconnects are then formed by positioning the corresponding pads on the board to be joined adjacent the solder bumps on the chip and reflowing the bumps at an elevated temperature. The C4 joining process is self-aligning in that the wetting action of the solder will align the chip bump pattern to the corresponding pads on the board.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste is reflowed in an inert atmosphere and homogenizes the pad and brings the solder into a spherical shape. The solder spheres on the substrate are then aligned to corresponding pads on the electronic structure or board to be connected thereto. After alignment, the substrate and board go through a reflow operation to melt the solder and create a solder bond between the corresponding pads on the substrate and other electronic component. The interconnection is typically in a form of a double truncated sphere and is termed a ball grid array (BGA). When the solder structure is in the form of a column, it is termed a column grid array (CGA).

It has now been proposed to use lead free solders in BGA/CGA interconnect schemes and these solders generally necessitate the use of higher temperatures during reflow attachment. Even higher than the attach temperatures are the temperatures required to do rework for removing defective modules and components, typically if the existing rework methods and tools are to be used. These excessive temperatures (typically above ~250° C.), can cause irreparable damage to the organic board substrate. Current methods require the use of such high temperatures to ensure that the solder joints reach the liquidus or eutectic temperature of the alloy (~221° C. for eutectic Sn/Ag and ~217° C. for eutectic Sn/Ag/Cu). Rework of lead free alloys containing assemblies has become a critical issue in the qualification of this technology because of the high rework temperatures required.

Bearing in mind the problems and deficiencies of the prior art, it is therefore an object of the present invention to provide a method for separating electronic components joined by solder connections and, in particular, lead-free solder connections in a BGA or CGA interconnect assembly such as a chip joined to a printed circuit board.

It is another object of the present invention to provide an apparatus for separating electronic components joined by solder connections and, in particular, joined together by lead-free solders in a BGA or CGA interconnect assemblies such as a chip joined to a printed circuit board.

It is yet another object of the present invention to provide an electronic component assembly reworked using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for separating electronic components joined by solder connections comprising the steps of:

supplying an electronic component assembly having at least two components joined by a plurality of solder interconnections typically arranged in a row-by-row configuration and having a first thickness;

providing a cutting element having a thickness less than the first thickness of the solder interconnections;

heating the cutting element to a temperature sufficient to melt the solder at the point of contact when the cutting element is in contact with and forced against the solder interconnections;

positioning the heated cutting element adjacent a row of the solder interconnections;

applying a force to advance the heated cutting element through the row of solder interconnections whereby the heated cutting element engages and cuts through the solder interconnections and severs the row of solder interconnections;

continuing the above steps to cut and sever all the solder interconnections; and separating the two components.

In a further aspect of the invention, the cutting element is a wire or a blade and is preferably moved sideways to the direction of travel of the cutting device either in one direction or in a reciprocating motion to provide a sawing effect as the cutting element is moved forward through the rows of solder interconnections.

In another aspect of the invention, the cutting element in the cutting device is a water knife which forms a high pressure water stream directed as a jet at the rows of solder interconnections to provide a cutting action to cut and sever the rows of solder interconnections.

In a further aspect of the invention, an apparatus is provided for separating electronic components joined by solder interconnections comprising:

securing means to hold an electronic assembly having at least two components joined by a plurality of solder interconnections arranged typically in a row-by-row configuration and having a first thickness;

a cutting element having a thickness less than the thickness of the solder interconnections;

a heater to heat the cutting element to a temperature sufficient to melt the solder at the point of contact when the cutting element is contacted with and forced forward against the solder interconnections;

positioning means to position the heated cutting element adjacent one of the rows of solder interconnections;

advancing means to force the heated cutting element against the row of solder interconnections and through the row of solder interconnections whereby the heated cutting element cuts and severs the row of solder interconnections; and separating means to separate the two components when all the solder interconnections have been cut and severed by the heated cutting element.

In an additional aspect of the invention chips and other electronic components secured to a printed circuit board or other electronic component may be separated and/or reworked by removing one of the joined components e.g., a chip, and securing a new component, e.g., a chip to the other component, e.g., printed circuit board, using the method and apparatus of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
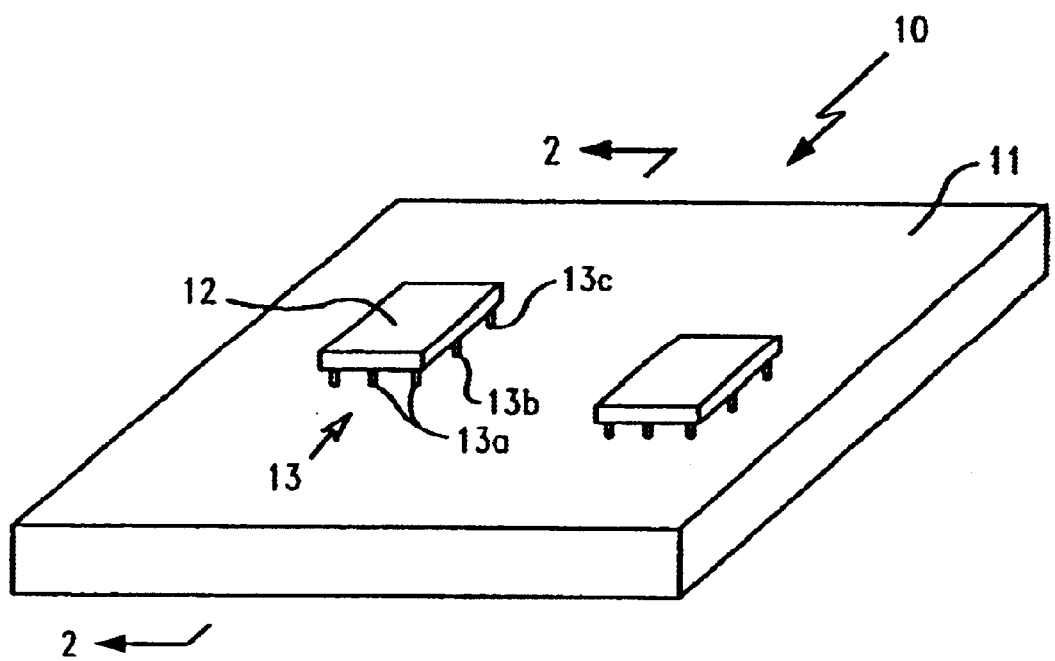
FIG. 1 is an enlarged perspective schematic view of an electronic component assembly comprising a substrate having chips attached thereto with rows of C4 solder ball interconnections.

In describing the preferred embodiment of the present invention, reference will be made herein to FIGS. 1–4B of the drawings in which like numerals refer to like features of the invention. Features of the invention are not necessarily shown to scale in the drawings.

Referring to FIG. 1, an electronic component assembly of the prior art is shown generally as 10. The assembly comprises a substrate 11 having another electronic component 12 attached thereto by a plurality of solder balls 13. The solder balls 13 are typically in a row-by-row array such as shown in the figure which is a 3×3 array which would contain nine (9) solder ball interconnections. Typically the arrays could be 25×25 or higher. The solder balls are numbered by rows as 13a, 13b and 13c.

The substrate 11 and other electronic component 12 may be any electronic components as is well known in the art. For convenience the following description will be directed to substrate 11 being an organic printed circuit board and the electronic component 12 attached thereto being a chip. Also, the solder interconnections 13 will be referred to as solder balls (e.g., ball grid array (BGA)) although it will also be appreciated by those skilled in the art that other solder interconnections such as columns (e.g., column grid array (CGA)) may also be used to attach the components.

Figure 2A:
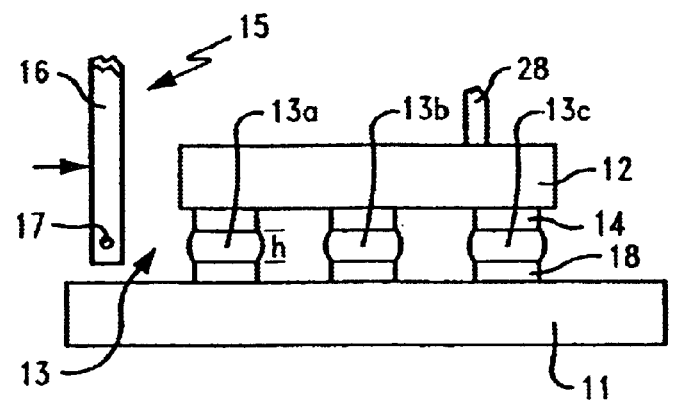
FIG. 2A is a schematic cross-sectional view of FIG. 1 taken along line 2—2 and an apparatus of the invention used to cut the C4 solder ball interconnections using the method of the invention.

Referring now to FIG. 2A, this figure shows a cross-sectional view of the electronic component assembly of FIG. 1 taken along line 2—2. The printed circuit board substrate 11 is shown having a chip 12 electrically connected thereto by solder balls 13 in a 3×3 array as shown in FIG. 1. The solder balls are connected by pads 14 or the chip 12 and pads 18 on the printed circuit board 11. The solder balls are in the form of double truncated spheres.

The object of the invention is to sever (cut) the solder balls 13 without damaging the chip and/or board so that the chip 12 may be separated from the printed circuit board 11 for rework or other purposes.

A cutting device is shown generally as 15 and comprises a vertical structural member 16 having a wire 17 attached thereto near the bottom of the structural member. The cutting device 15 is positioned over the printed circuit board 11 and is to be moved forward in the direction of the arrow toward the first solder ball row 13a. A vise or other securing device 28 is used to hold the chip (and/or the board) secure during the cutting operation.

It is an important feature of the invention that the wire 17 be heated and maintained at a suitable temperature during the method of the invention to cut the row of solder balls 13a (and next rows of solder balls 13b and 13c) and sever each of the solder balls so that the printed circuit board 11 can be removed from the chip 12.

Heating of the wire 17 may be done using any suitable means and will preferably comprise using a heating element in structural member 16 or externally and then fed to the wire. The temperature of the wire 17 is sufficient to melt the row of solder balls 13 at the point of contact between the wire and the solder preferably by the temperature of the wire and the frictional force applied to the solder balls by the forward movement of the cutting device 15. It should be appreciated that some of the solder not contacted by the wire will melt but this is preferably minimal. Also, the heat transferred to the circuit board or chips is also minimal so that the temperature of these components does not rise appreciably to cause damage to the component.

Alternatively, a blade could be employed instead of a wire, whereby the blade acts as a plow and removes a portion of the molten solder from the interconnection joint. This would prevent reattachment of the molten solder after the wire passes through the joint. The blade is preferably angled as shown in FIG. 3C such that the removed solder is pushed (plowed) out the side of the component where preferably a vacuum is used to remove the solder.

Figure 4A:
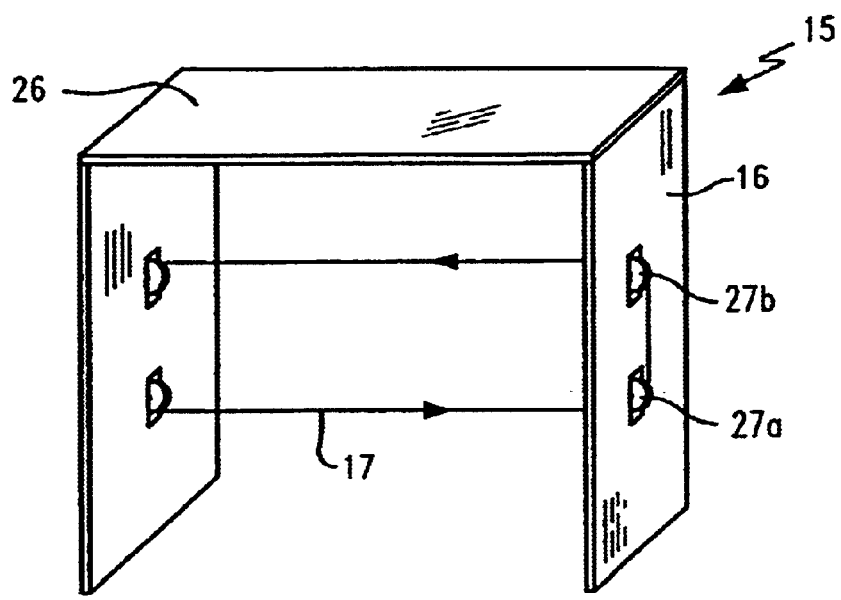
FIGS. 4A and 4B show other devices of the invention for cutting and severing the C4 solder ball interconnections.
Figure 4B:
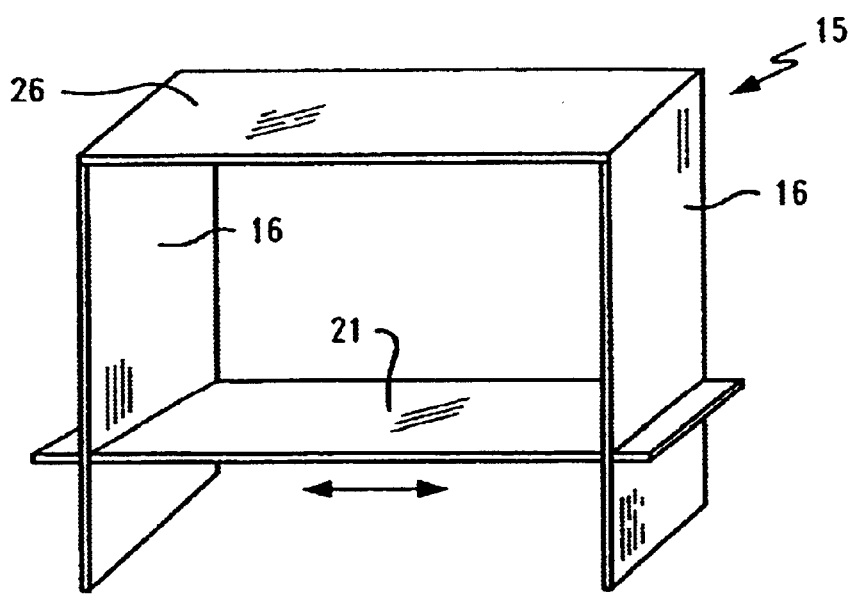

Preferably, as shown in FIGS. 4A and 4B, the wire or blade is moved transverse to the forward motion of the device 15 to effect both a solder ball cutting and sawing effect.

The cutting device 15 shown in FIG. 2A uses only a heated wire 17 and forward movement of the wire and does not show the use of a transverse moving wire to also saw the solder ball and enhance the cutting of the rows of solder balls 13.

Figure 2B:
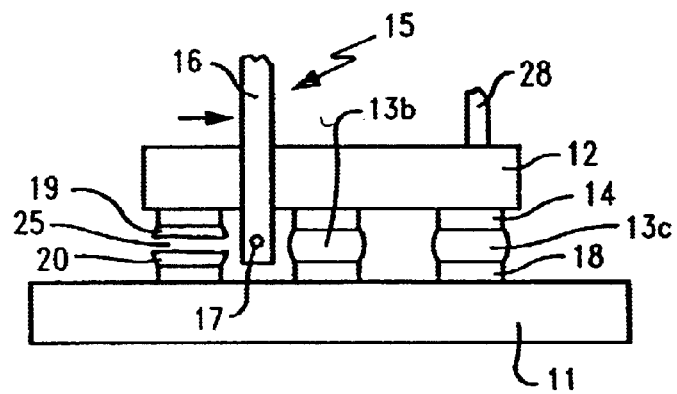
FIGS. 2B–2D show a sequence of operations in which the rows of solder balls of FIG. 2A are cut and severed so that the chip may be removed from the substrate.

After the wire 17 is heated to a sufficient temperature it is moved forward toward the row of solder balls 13a in the direction of the arrow and, as shown in FIG. 2B, has passed the first solder ball array 13a severing each of the three (3) solder balls in the row of solder balls 13a into an upper portion 19 and a lower portion 20. An opening 25 is thus formed so that each solder ball in row 13a is now separated from the components 12 and 11 which were joined together by the row of solder balls.

Figure 2C:
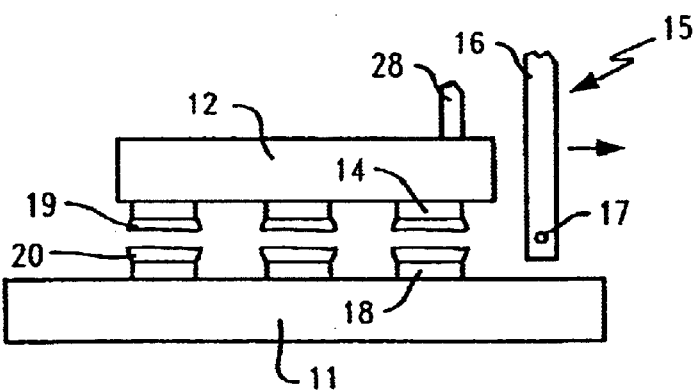

The forward motion of cutting device 15 is continued in the direction of the arrow and, as shown in FIG. 2C, has passed the solder ball row 13c and has likewise severed or cut all three rows of solder balls 13a, 13b and 13c so that all the solder balls in the three rows are now separated into an upper portion 19 and a lower portion 20.

Figure 2D:
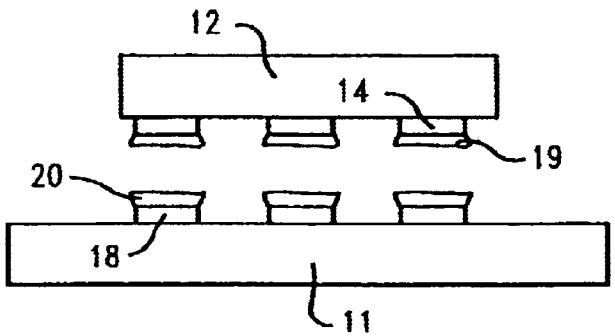

As shown in FIG. 2D the chip component 12 has been lifted from the printed circuit board 11 so that the chip 12 can now be replaced or the assembly otherwise reworked to form the desired assembly.

It will be appreciated by those skilled in the art that it is an important feature of the invention to cut the solder balls connecting the two electronic components using a heated wire or other heated implement as discussed hereinbelow and as shown in the other figures.

The wire 17 shown in FIGS. 2A–2C used to cut the solder balls may be any suitable wire of any suitable thickness. The thickness of the wire will typically depend on the height h of the solder ball 13 and preferably for a solder ball height of about 0.02 inch a wire diameter of about 0.005 inch is suitable. The wire may be selected from a wide variety of materials, and not limited to, such as tungsten, molybdenum, high carbon steel and brass.

As noted above, it is a preferred embodiment of the invention that the wire be moved sideways relative to the forward motion of the cutting device to provide a frictional or sawing action to the solder balls as well as a heating and cutting of the solder ball due to the temperature and forward motion of the wire. Such a sawing action may be a accomplished by moving the wire 17 in an endless loop as shown in FIG. 4A so that the wire 17 is moving at a direction transverse to the direction of movement of the cutting device 15 and provides a sawing or cutting frictional action on the solder ball surface. The wire revolves around pulleys 27a and 27b in a continuous endless loop in the direction of the arrow to provide a sawing action in addition to the cutting action provided by the elevated temperature and forward motion of the wire 17.

The wire may have an abrasive or other cutting member on the surface of the wire to increase the sawing action of the wire. It is an important feature of the invention however, that the wire 17 be heated to a sufficient temperature to effect cutting of the solder balls and the temperature will be dependent on the cutting action of the wire with a lower wire temperature being typically used for a highly abrasive wire. In general, the temperature of the wire will exceed the liquidus temperature of the solder being cut.

Referring now to FIGS. 3A–3D, various embodiments of the cutting device 15 of the invention are shown in schematic.

Figure 3A:
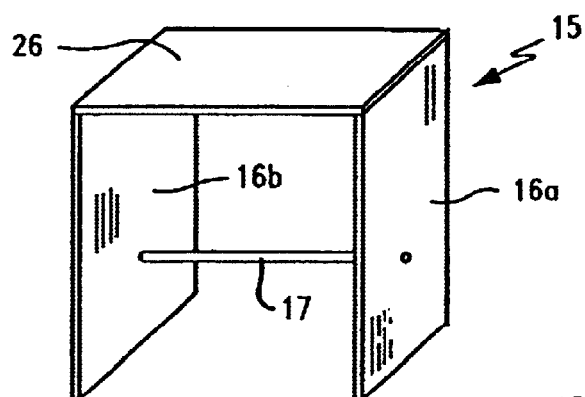
FIGS. 3A–3D show different schematic devices of the invention for cutting and severing the C4 solder ball interconnections.

In FIG. 3A a cutting device 15 is shown which is the same as the cutting device 15 shown and used in FIGS. 2A–2D. Thus, two vertical structural members 16 are joined by a horizontal upper member 26 to form a cutting device 15 which may be moved along the surface of the circuit board or other substrate which is connected to another electronic component to be separated therefrom. A wire 17 extends between the vertical structural members 16 and is positioned at a height which will be intermediate the height h of the solder ball when the cutting device 15 is moved forward across the surface of the printed circuit board.

Another embodiment of the wire containing cutting device 15 of FIG. 3A is shown in FIG. 4A in which the wire may be circulated around an endless loop to provide an enhanced sawing and cutting action as noted above.

Figure 3B:
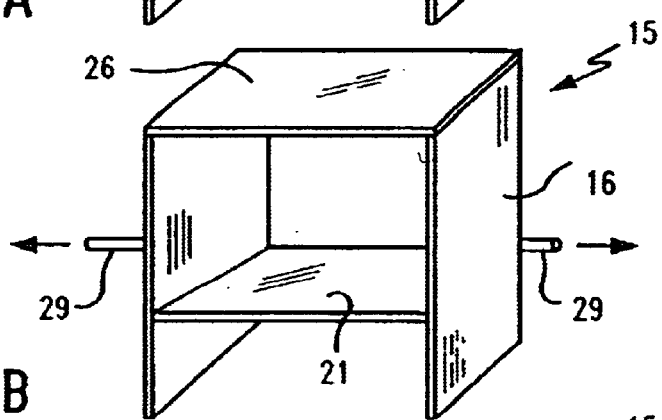
Figure 3C:
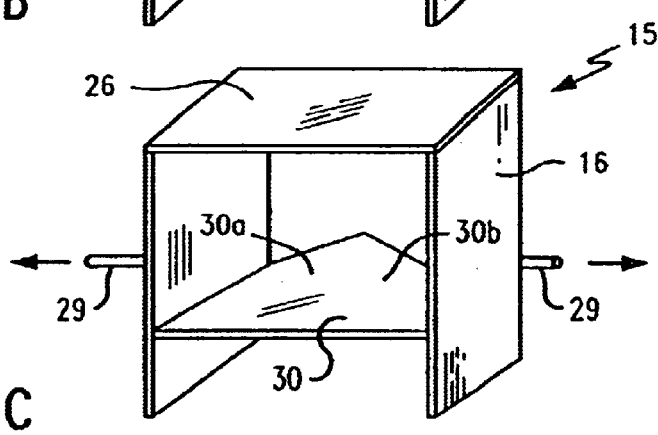

In FIG. 3B another cutting device 15 is shown again having vertical structural members 16 connected by an overhead horizontal member 26. A blade or other thin device extends between the vertical structural members 16. A vacuum port 29 is shown to remove molten solder as the blade is moved through the solder interconnect during cutting of the interconnect. As with the cutting device of FIG. 3A using a wire 17, the blade will move forward against the rows of solder balls 13 and cut the solder balls due to the thickness of the blade and the elevated temperature of the blade. The blade 21 may be provided with a reciprocating back and forth sawing motion to enhance the cutting action of the blade as shown in FIG. 4B. The blade can also be a continuous blade, i.e., band, as in a band saw. The thickness of the blade may vary widely and is less than the height h of the solder ball. A thickness of about 0.002 to 0.010 inch or more can be used. The width of the blade will generally be less than 50 mm although larger blades can be used depending on the solder interconnect to be cut.

In FIG. 3C the blade 30 is shown angled having angled edges 30a and 30b. This configuration enhances the plowing action of the blade 30 as it moves through the solder balls and pushes the removed solder along the edges to the vacuum ports 29.

Figure 3D:
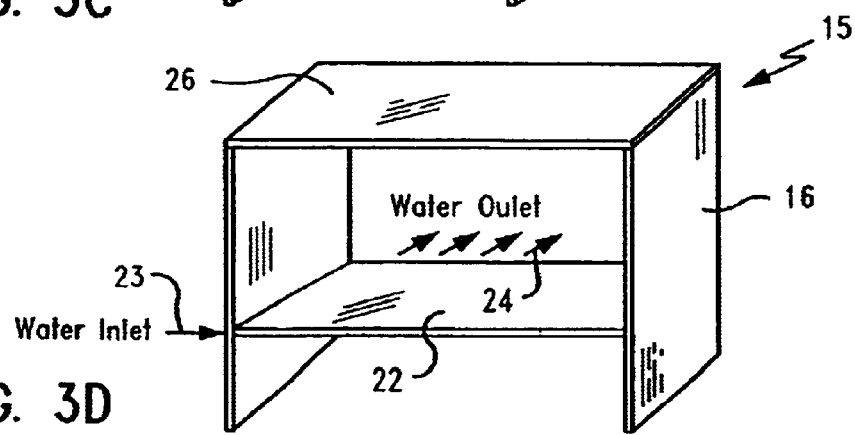

In FIG. 3D another embodiment of the invention is shown with the cutting device 15 having vertical structural members 16 and a connecting overhead horizontal member 26. Extending between the vertical members 16 is a thin water jet 22 which water jet has a water inlet 23 and a water outlet 24. As with the other embodiments, the cutting device 15 will be forced to move forward across the surface of the printed circuit board against rows of the solder balls and the water from the outlet jets cut and sever the rows of solder balls 13. Other fluids may be used. A typical jet fluid pressure is about 20,000 to 60,000 psi. The thickness of the water jet is generally about 0.002 to 0.040 inch. Commercial water jets made by Precision Cutting Systems, Jet Edge or JIT precision water jet cutting devices or any other suitable water jet can be used.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for separating electronic components joined by a row-by-row array of solder interconnections comprising the steps of:

supplying an electronic component assembly having at least two components joined by a plurality of solder interconnections in a row-by-row array and having a first thickness;

providing a water jet cutting element having a thickness less than the first thickness of the solder interconnections and which element has a front edge which extends across a row of solder interconnections and which has a plurality of water let openings spaced along the front edge of the element;

positioning the water jet cutting element adjacent one of the rows of the solder interconnections;

applying a force to advance the water jet cutting element through the row of solder interconnections whereby water jets from the openings in the water jet cutting element engage and simultaneously cuts through each solder interconnection in the row of solder interconnections and severs the row of solder interconnections;

continuing the above steps for the remaining rows of solder interconnections to cut and sever all the rows of solder interconnections; and separating the two components.

2. An apparatus for separating electronic components joined by a row-by-row array of solder interconnections comprising:

securing means to hold an electronic assembly having at least two components joined by a plurality of solder interconnections in a row-by-row array and having a first thickness;

a water jet cutting element having a thickness less than the thickness of the solder interconnections and which element has a front edge which extends across a row of solder interconnections and which has a plurality of water jet openings spaced along the front edge of the element;

positioning means to position the front edge of the water jet cutting element adjacent one of the rows of solder interconnections;

advancing means to force the water jet cutting element against the row of solder interconnections and through the solder interconnections whereby water jets from the openings in the water jet cutting element simultaneously cut and sever each solder interconnection in the row of solder interconnections; and separating means to separate the two components when all the rows of solder interconnections have been cut and severed row-by-row by the water jet cutting element.

3. The method of claim 1 wherein the water jet has a fluid pressure of about 20,000–60,000 psi.

4. The method of claim 3 wherein the water jet has a thickness of about 0.002–0.040 inch.

5. The apparatus of claim 2 wherein the water jet from the water jet cutting element has a pressure of about 20,000–60,000 psi.

6. The apparatus of claim 5 wherein the water jet from the water jet cutting element has a thickness of about 0.002–0.040 inch.

* * * * *